United States Patent [19]
Castle

[11] Patent Number: 5,818,886
[45] Date of Patent: Oct. 6, 1998

[54] PULSE SYNCHRONIZING MODULE

[75] Inventor: David Edgar Castle, Poway, Calif.

[73] Assignee: Unisys Corporation, Blue Bell, Pa.

[21] Appl. No.: 697,310

[22] Filed: Aug. 22, 1996

[51] Int. Cl.$^6$ ........................................................ H04L 7/00
[52] U.S. Cl. ............................................ 375/354; 327/160
[58] Field of Search ..................................... 375/354, 359, 375/360; 327/141, 151, 160; 370/503

[56] References Cited

U.S. PATENT DOCUMENTS

| | | | |
|---|---|---|---|
| 4,821,295 | 4/1989 | Sanner | 375/360 |
| 4,935,942 | 6/1990 | Hwang et al. | 375/354 |
| 5,155,745 | 10/1992 | Sugawara et al. | 375/360 |

*Primary Examiner*—Temesghen Ghebretinsae
*Attorney, Agent, or Firm*—Charles J. Fassbender; Mark T. Starr; Steven R. Petersen

[57] ABSTRACT

A pulse synchronizing module includes: a) a pair of input leads which respectively receive a clock signal and digital input pulses that are asynchronous to the clock signal; b) a first counter circuit which is triggered by rising edge transitions in the input pulses, and a second counter circuit which is triggered by falling edge transitions in the input pulses; c) first and second registers which, in synchronization with the clock signal, sample respective counts in the first and second counter circuits; and d) an output circuit, coupled to the first and second registers. This output circuit generates, the rising edge of an output pulse, in synchronization with the clock signal, when the count sample in the first register differs from the number of rising edges which the output circuit previously generated; and it generates the falling edge of the output pulse, in synchronization with the clock signal, when the count sample in the second register differs from the number of falling edges previously generated. With this pulse synchronizing module, the samples in the first and second registers can contain errors if the samples are taken while the counters are triggered; and despite these errors, the number of output pulses which are generated will still equal the number of input pulses.

16 Claims, 6 Drawing Sheets

PULSE SYNCHRONIZING MODULE

BACKGROUND OF THE INVENTION

This invention relates to the structure of a pulse synchronizing module which receives an arbitrary number of digital input pulses that occur asynchronous to a clock signal, and which generates a corresponding number of output pulses in synchronization with the clock signal.

In digital data processing systems, it is conventional to perform various operations in synchronization with a clock signal. For example in a digital computer, instructions are typically executed in synchronization with a clock signal; and similarly within a digital memory, read and write commands are typically executed in synchronization with a clock signal.

When the digital computer and the digital memory are intercoupled as one computer system, the clock signal which is used to synchronize the execution of the instructions within the computer can sometimes be the same clock signal which is used to synchronize the execution of read and write commands within the memory. Such a single clock system is practical, for example, when the digital computer and the digital memory have the same cycle time. In a digital computer, the cycle time is a certain time interval into which the execution of each instruction is partitioned; and in a digital memory, the cycle time is a certain time interval into which the execution of each command is partitioned.

If the cycle time of the digital computer and the cycle time of the digital memory are not equal, then the use of the same clock signal within the computer and the memory can waste time and result in a degraded performance. To improve this performance, a first clock signal can be used to synchronize the execution of instructions within the computer, and a second clock signal can be used to synchronize the execution of commands within the memory. These first and second clock signals can be completely independent and asynchronous to each other.

However, when such first and second asynchronous clock signals are used, then the read and write commands which are sent from the computer to the memory need to be re-synchronized within the memory; and any control signals which are sent from the memory back to the computer need to be resynchronized in the computer. If commands are sent to the memory in the form of pulses which are asynchronous to the second clock (i.e., the memory's clock), then a need arises for a pulse synchronizing module within the memory. Similarly, if the memory sends control signals to the computer in the form of pulses that are asynchronous to the first clock (i.e., the computer's clock), then a need arises in the computer for a pulse synchronizing module.

Accordingly, a primary object of the invention is to provide a novel pulse synchronizing module which receives digital input pulses that occur asynchronous to a clock signal, and which generates a corresponding number of output pulses in synchronization with that clock signal.

BRIEF SUMMARY OF THE INVENTION

One preferred embodiment of the present invention is a pulse synchronizing module which has the following structure: a) a pair of input leads which respectively receive a clock signal and digital input pulses that are asynchronous to the clock signal; b) a first counter circuit which is triggered by rising edge transitions in the input pulses, and a second counter circuit which is triggered by falling edge transitions in the input pulses; c) first and second registers which, in synchronization with the clock signal, sample respective counts in the first and second counter circuits; and d) an output circuit, coupled to the first and second registers. By this output circuit, the rising edge of an output pulse is generated, in synchronization with the clock signal, when the count sample in the first register does not equal the number of rising edges previously generated; and the falling edge of the output pulse is generated in synchronization with the clock signal, when the count sample in the second register does not equal the number of falling edges previously generated.

An important feature of the above embodiment is that a burst of several input pulses can be received, and subsequently, a corresponding number of output pulses will be generated by the output circuit. This feature is achieved because the counters keep track of the number of leading edges and number of trailing edges in the input pulses, while the output circuit keeps track of the number of leading edges and number of trailing edges in the output pulses. Thus, after a burst of several input pulses is received, the output pulses are generated until they equal the number of input pulses that were received.

Another important feature of this pulse synchronizing module is that the first and second registers can respectively sample the count in the first and second counters such that the samples are indeterminate and contain errors if the samples are taken while the counters are triggered; and despite these errors, the number of output pulses which are generated will still equal the number of input pulses. Such erroneous samples will intermittently be taken by the registers because the counters are triggered by the input pulses which occur asynchronous to the clock signal.

BRIEF DESCRIPTION OF THE DRAWINGS

Various preferred embodiments of the present invention are described herein in detail in conjunction with the accompanied drawings, wherein.

DETAILED DESCRIPTION

Figure 1:
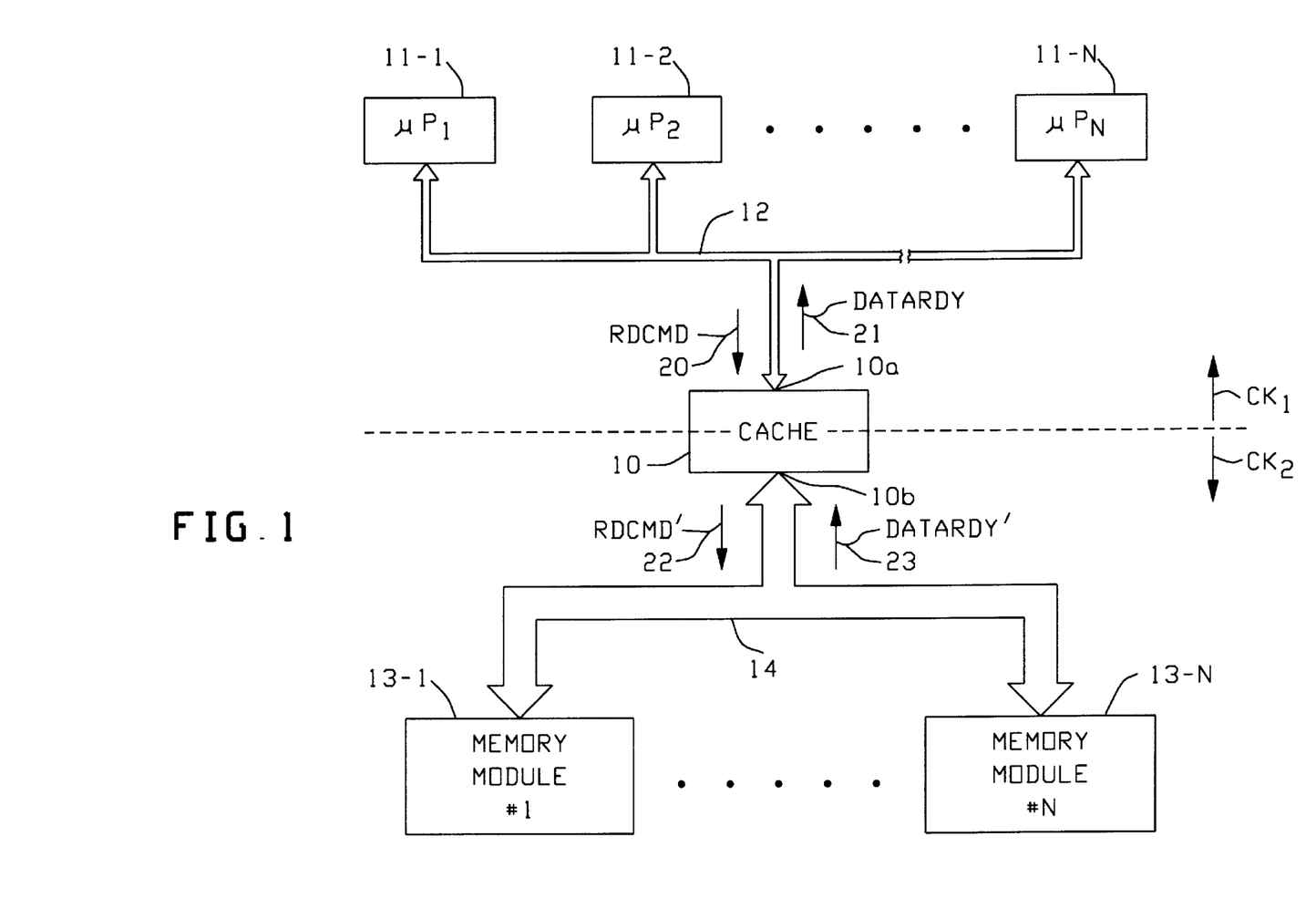
FIG. 1 shows a two-port cache memory which incorporates the present invention.

Referring now to FIG. 1, a two-port cache memory 10 which incorporates the present invention will be described. This cache memory 10 has one port 10a which is coupled to a set of M microprocessors 11-1 through 11-M via a microprocessor bus 12, and it has another port 10b which is coupled to a set of N main memory modules 13-1 through 13-N via a main memory bus 14.

In operation, each microprocessor sends read and write commands over the bus 12 to the port 10a of the cache memory 10. One such read command (labeled RDCMD) is indicated in FIG. 1 by reference numeral 20. In response to that read command 20, the cache memory 10 determines whether or not the requested data is presently stored within the cache. If the requested data is in the cache memory 10, then the cache responds by sending a data ready signal 21 (labeled DATARDY) along with the requested data from port 10a to the microprocessor which sent the read command 20.

Conversely, if the requested data is not presently stored in the cache memory 10, then the cache memory responds by sending another read command 22 (labeled RDCMD') from port 10b onto bus 14 to one of the main memory modules 13-1 through 13-N. Thereafter, in response to the RDCMD' command, one of the main memory modules sends another data ready signal 23 (labeled DATARDY') on bus 14 to the cache memory 10 along with an accompanying block of data. Then, the cache memory 10 responds by sending the signal DATARDY on bus 12 along with the data which was requested by the read command 20.

In order for the microprocessors 11-1 through 11-M to operate as fast as possible, those microprocessors and bus 12 are synchronized to one clock CK1; and similarly, in order for the main memory modules 13-1 through 13-N to operate as fast as possible, those modules and the bus 14 are synchronized to another clock CK2 which is completely independent of clock CK1. Clock CK1 has a frequency which is the highest frequency at which the microprocessors 11-1 through 11-M can operate; and clock CK2 has a frequency which is the highest frequency at which the memory modules 13-1 through 13-N can operate. As one example, clock CK1 can have a frequency of 100 MHz whereas clock CK2 can have a frequency of 60 MHz.

Within the cache memory 10, all operations which occur on port 10a are synchronized to clock CK1, while all operations which occur on port 10b of the cache memory 10 are synchronized to clock CK2. Thus, the read command 20 is received on port 10a in synchronization with clock CK1, while the read command 22 is sent from the port 10b in synchronization with clock CK2. Similarly, the data ready signal 23 is received on port 10b in synchronization with the clock CK2, while the data ready signal 21 is sent from port 10a in synchronization with clock CK1.

To perform the above operations, a circuit is needed within the cache memory 10 which receives the read commands on port 10a in synchronization with clock CK1 and regenerates corresponding commands in synchronization with clock CK2. Similarly, a circuit is needed which receives data ready signals on port 10b in synchronization with clock CK2 regenerates corresponding signals in synchronization with clock CK1.

Figure 2:
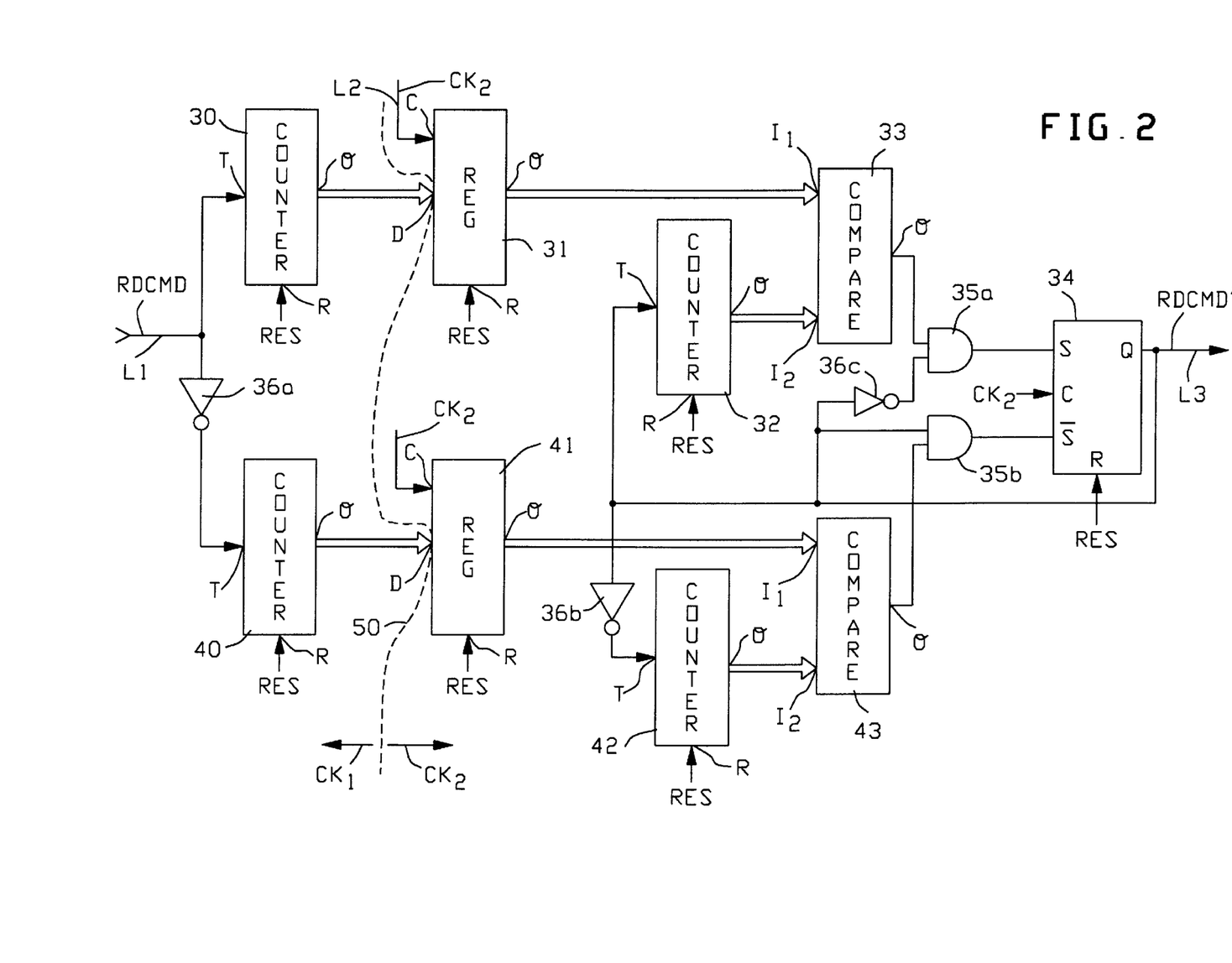
FIG. 2 is a logic diagram of a pulse synchronizing module which constitutes one preferred embodiment of the present invention and which is incorporated into the cache memory of FIG. 1.

Now, in accordance with the present invention, this regenerating of the commands and the control signals is performed by a circuit which is shown in FIG. 2. All of the components in the FIG. 2 circuit are described below in TABLE 1.

TABLE 1

| Component | Description |
| --- | --- |
| 30, 32, 40, and 42..... | Each of the components 30, 32, 40, and 42 is four bit binary up counter which has a trigger input T, a reset input R, and a count output O. When input R receives a "1," the counter is reset to a count of 0000. During the time that input R receives a "0," the |

TABLE 1-continued

| Component | Description |
| --- | --- |
| | counter counts up by one each time the trigger input T receives a "0" to "1" transition. When a count of 1111 is reached, the next "0" to "1" transition on the trigger T causes the count to wrap to 0000. |
| 31 and 41.............. | Each of the components 31 and 41 is a four bit register which has a clock input C, a reset input R, a data input D, and a data output O. When the reset input R receives a "1", the register output is reset to 0000. During the time that input R receives a "0," the data input D is sampled and stored in the register each time the clock input C receives a "0" to "1" transition. |
| 33 and 43.............. | Each of the components 33 and 43 is a comparator which has two inputs I1 and I2, and one output O. When the inputs I1 and I2 receive signals which are not equal, a "1" occurs on the output O; and when the inputs I1 and I2 receive signals which are equal, a "0" occurs on the output O. |
| 34..................... | Component 34 is a clocked flip-flop which has a reset input R, a clock input C which operates in conjunction with two other inputs S and $\bar{S}$, and an output Q. When input R is a "1", the output Q is forced to "0". When a "0" to "1" transition is received on the clock input C while input R is a "0", then: a "1" occurs on the Q output if the input S is receiving a "1"; a "0" occurs on the Q output if the input $\bar{S}$ is receiving a "1"; and the Q output stays unchanged if the inputs S and $\bar{S}$ are both receiving a "0". |
| 35a and 35b............ | Each of the components 35a and 35b is a two input AND gate. |
| 36a, 36b, and 36c...... | Each of the components 36a, and 36b, and 36c is an inverter. |

Inspection of the FIG. 2 circuit shows that it has an input lead L1 on which each read command RDCMD is received, another input lead L2 on which the clock CK2 is received, and an output lead L3 on which each read command RDCMD' is generated. Each read command RDCMD on lead L1 occurs in synchronization with clock CK1, whereas each corresponding read command RDCMD' on lead L3 occurs in synchronization with clock CK2. All components in FIG. 2 which lie to the left of a dashed line 50 operate in synchronization with clock CK1, while all components which lie to the right of the dashed line 50 operate in synchronization with the clock CK2.

Within the cache memory 10, another copy of the FIG. 2 circuit receives the DATARDY' signals 23 in synchronization with clock CK2 and regenerates the corresponding signals DATARDY 21 in synchronization with clock CK1. In that circuit, lead L1 receives the DATARDY' signal, lead L2 receives clock signal CK1, and signal DATARDY 21 is generated on lead L3. Components to the left of the dashed line 50 operate in synchronization with clock CK2, while components to the right of the dashed line 50 operate in synchronization with clock CK1.

Figure 3:
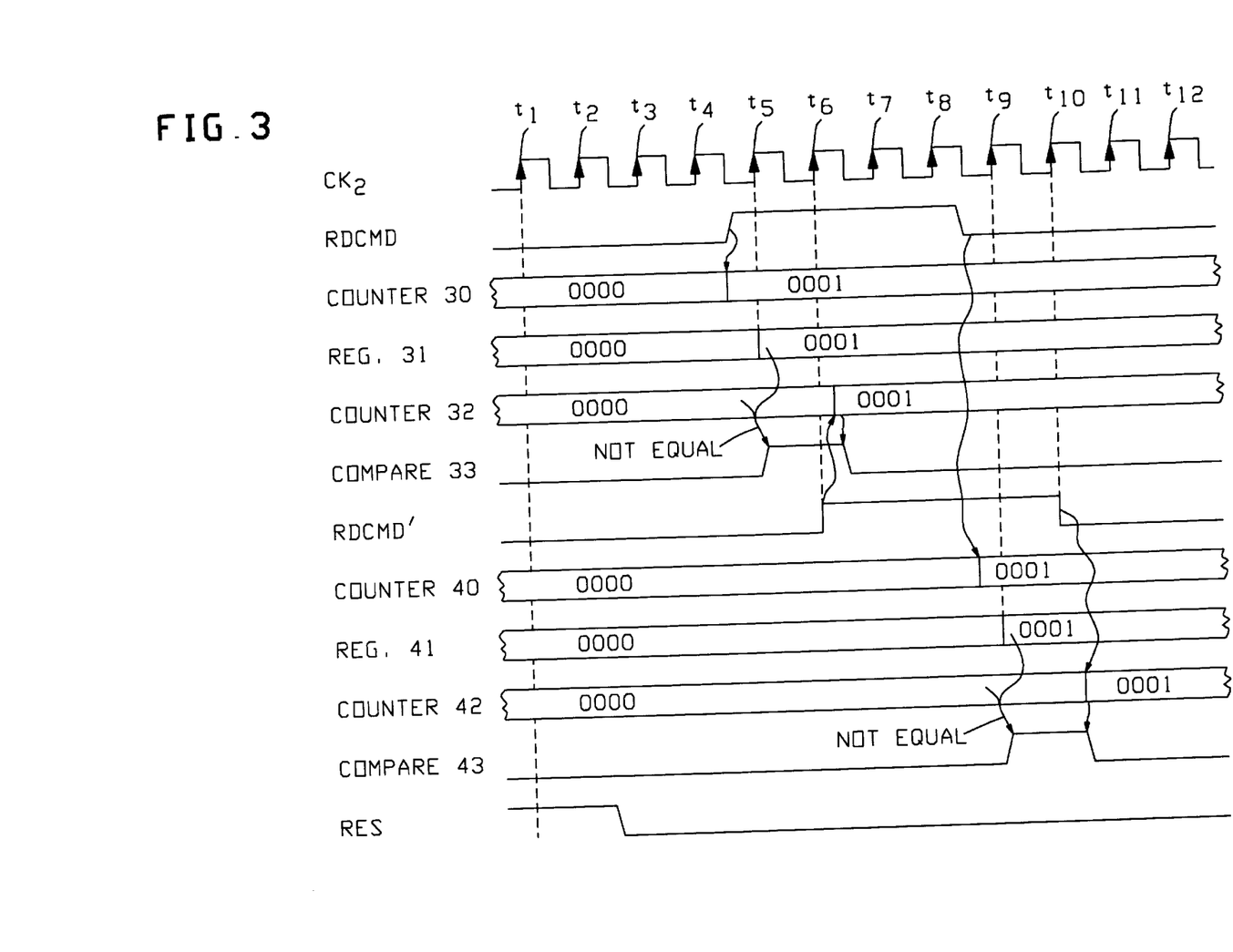
FIG. 3 is a timing diagram which illustrates a signal sequence that occurs in the FIG. 2 module.
Figure 4:
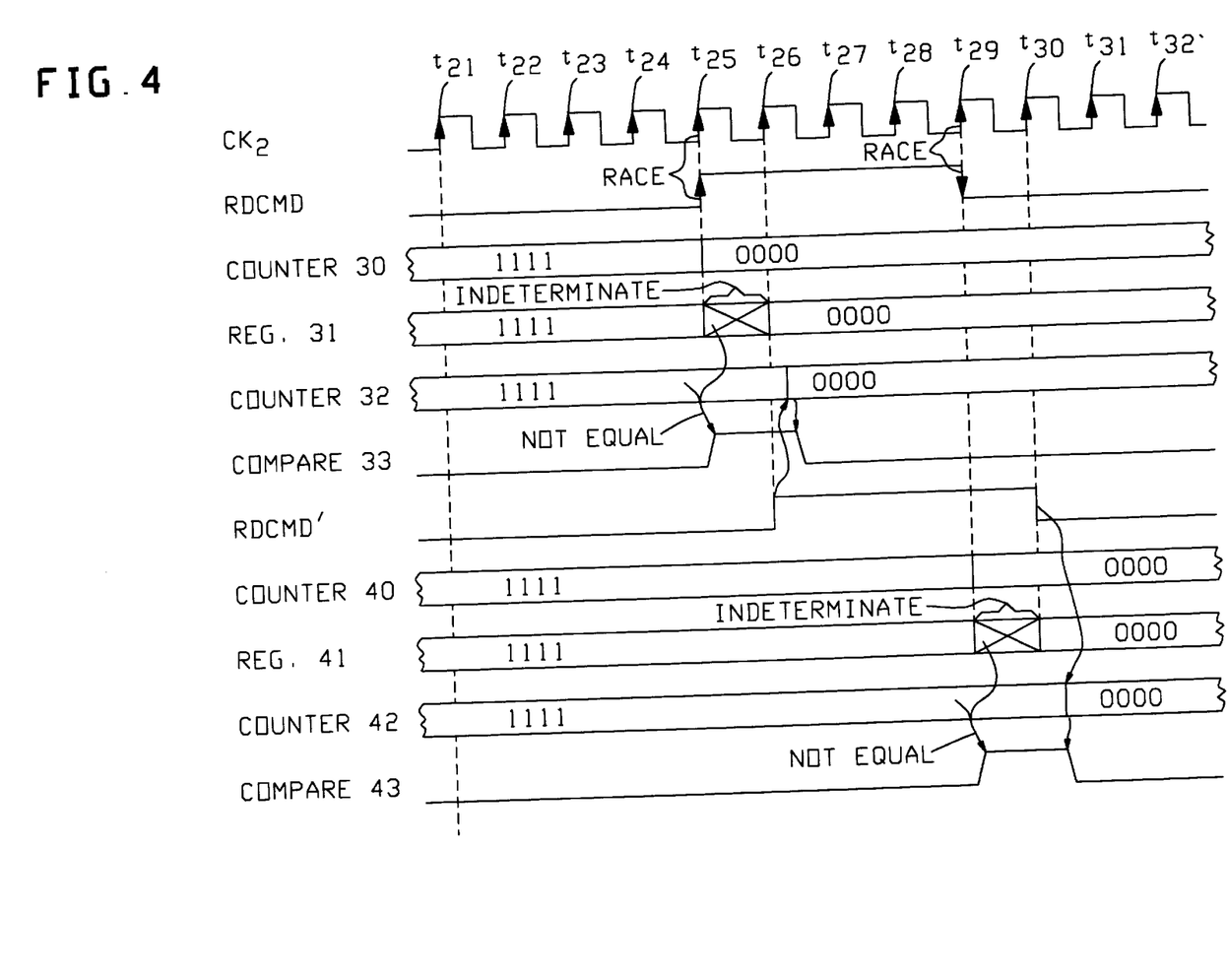
FIG. 4 is another timing diagram which illustrates a second signal sequence which occurs in the FIG. 2 module.

How the FIG. 2 circuit operates in response to each read command RDCMD is illustrated by the timing diagrams of FIGS. 3 and 4. Initially at time t1 in FIG. 3, a reset signal RES is generated by an external source as a "1" in order to place the FIG. 2 circuit in an initial state. Consequently, the output O of all of the components 30, 31, 32, 40, 41, and 42 is forced to "0000", and the output Q of flip-flop 34 is forced to a "0". Thereafter at time t2, the reset signal RES is generated as a "0", and that enables the read commands to be received on lead L1.

Each read command RDCMD on lead L1 has the shape of a pulse. This is shown in FIG. 3, wherein the read command RDCMD has a rising edge which occurs between time instants t4 and t5 and a falling edge which occurs between time instants t8 and t9. Within the FIG. 2 circuit, the rising edge of each read command RDCMD triggers the counter 30 and thereby causes the output of counter 30 to be incremented by one. Similarly, the falling edge of each read command triggers the counter 40 and thereby causes the output of counter 40 to be incremented by one.

Counter 30 has its output coupled to the D input of register 31, and that register has a clock input CK2. Consequently, register 31 samples and stores the count from the counter 30 on each rising edge of the clock CK2. Similarly, register 41 samples and stores the count in counter 40 on each rising edge of the clock CK2.

Each count sample which is stored in register 31 is sent to the comparator 33 where it is compared with the output of counter 32. If a miscompare occurs, the output from the comparator 33 is generated as a "1", and this occurs in FIG. 3 at time t5. From time t5 to time t6, the "1" from the comparator 33 passes through the AND gate 35a to the S input of flip-flop 34. Thus at time t6, the output of flip-flop 34 becomes a "1".

Flip-flop 34 has its Q output fed back to the trigger input of the counter 32. Consequently, when the Q output of flip-flop 34 switches from a 0 to a 1 at time t6, the counter 32 is triggered; and that causes the output count from counter 32 to be incremented to "0001". This makes both inputs to the comparator 33 equal to each other, and thus the output from the comparator 33 after time t6 is generated as a "0".

Similarly, the count samples in register 41 are sent to comparator 43 where they are compared with the count in counter 42. When a miscompare occurs, the output of comparator 43 is generated as a "1", and such a miscompare occurs in FIG. 3 at time t9.

From time t9 to time t10, the "1" output from comparator 43 passes through the AND gate 35b to the $\overline{S}$ input of flip-flop 34. Then, at time t10, the Q output of flip-flop 34 changes to a "0" in response to the "1" on the $\overline{S}$ input and the 0 to 1 transition of clock CK2.

When the Q output of flip-flop 34 switches to a "0" at time t10, the trigger input to counter 42 makes a "0" to a "1" transition. This in turn, causes the count in counter 42 to be incremented by one. Consequently, the two inputs to the comparator 43 become equal, and that in turn, causes the output of the comparator 43 to become a "0". This occurs in FIG. 3 following time t10.

For all read commands that are subsequently received on input lead L1, counter 30 counts the rising edges of the commands, while counter 40 counts the falling edges of the commands. Registers 31 and 41 then operate in synchronization with clock CK2 to respectively sample the counts that are in the counters 30 and 40.

If the count sample in the register 31 does not equal the number of rising edges previously generated (as determined by counter 32) and the Q output of flip-flop 34 is a "0", then a rising edge for the command RDCMD' is generated on lead L3. Similarly, if the count sample in register 41 does not equal the number of falling edges previously generated (as determined by counter 42) and the Q output of flip-flop 34 is a "1", then a falling edge for the command RDCDMD' is generated on lead L3.

One important feature of the FIG. 2 circuit is that several input pulses on lead L1 can occur in bursts and a corresponding number of output pulses will still be generated on lead L3. This feature is achieved because counters 30 and 40 respectively keep track of the number of leading edges and number of trailing edges in the input pulses on lead L1; while the counters 32 and 42 respectively keep track of the number of leading edges and number of trailing edges in the output pulses on lead L3. Thus, if a burst of several input pulses is received, the output pulses will continue to be generated until counters 30 and 32 hold the same count, and counters 40 and 42 hold the same count.

Another important feature which is achieved by the FIG. 2 circuit is that the output pulses are properly generated on lead L3 even when the count samples that are taken by the registers 31 and 41 contain errors. Such errors in the count samples will occur intermittently because clock CK2 is asynchronous to the input pulses which are received on lead L1; and thus the count in counter 30 and/or counter 40 can change at the instant they are being sampled by registers 31 and 41. This "race" scenario is illustrated in FIG. 4.

From time t21 to t24 in FIG. 4, all of the components 30, 31, 32, 40, 41 and 42 are shown as storing a count of 1111. Then, the rising edge of a read command RDCMD occurs on lead L1, and that causes the count in counter 30 to change from 1111 to 0000 at time t25. Also at time instant t25, register 31 takes a sample of the count which is in counter 30. However, that sample, is indeterminate since at time instant t25, the count in counter 30 is changing.

Consequently, from time t25 to time t26 in FIG. 4, the output of register 31 is shown as an "X". This "X" indicates that the count sample in register 31 is indeterminate and contains errors. For example, the count sample in register 31 could be 1010, or 0011, or any other 4-bit binary number.

Regardless of what count sample is stored in register 31, that sample is sent to the comparator 33 where it is compared with a 1111 from counter 32. Thus, even if the count sample in register 31 contains an error, a miscompare will occur which causes the output of comparator 33 to be a "1". This occurs in FIG. 4 following time t25.

Thereafter, at time t26, a rising edge of the read command RDCMD' is generated by flip-flop 34 in response to the "1" from comparator 33. Also at time t26, register 31 takes another sample of the count in counter 30. When this sample is taken, the count in register 30 is 0000; and consequently, register 31 stores 0000.

While the above sample is taken by register 31 at time t26, the rising edge of the command RDCMD' which is generated by flip-flop 34 is fed back to the trigger input of counter 32. This causes the output of counter 32 changes from 1111 to 0000. Thus, the two inputs to comparator 33 become equal, and so the output of comparator 33 becomes a "0".

Similarly, at time t29 in FIG. 4, register 41 takes a sample of the count in counter 40 while the count is changing from 1111 to 0000. This change in the count in counter 40 occurs in response to the falling edge of the command RDCMD' on input lead L1. Since the sample in register 41 is taken while the count in counter 40 is changing, the resulting sample is indeterminate; and thus from t29 to t30, the output of register 41 is shown as an "X".

Regardless of what sample is stored in register 41 at time t29, a miscompare will occur with the count of 1111 which is stored in counter 42. This miscompare causes a "1" to occur on the output of comparator 43; and thus at time t30, a falling edge of the command RDCMD' is generated by flip-flop 34. That falling edge is fed back as a trigger to counter 42, so the count in counter 42 changes to 0000.

Also at time t30, register 41 takes another sample of the count in counter 40; and this time, a sample of 0000 is obtained. Consequently, both inputs to the comparator 43 are equal, and thus the output of the comparator 43 becomes a "0".

One preferred embodiment of the invention has now been described in detail. In addition, however, various changes and modifications can be made to this preferred embodiment without departing from the nature and spirit of the invention.

Figure 5:
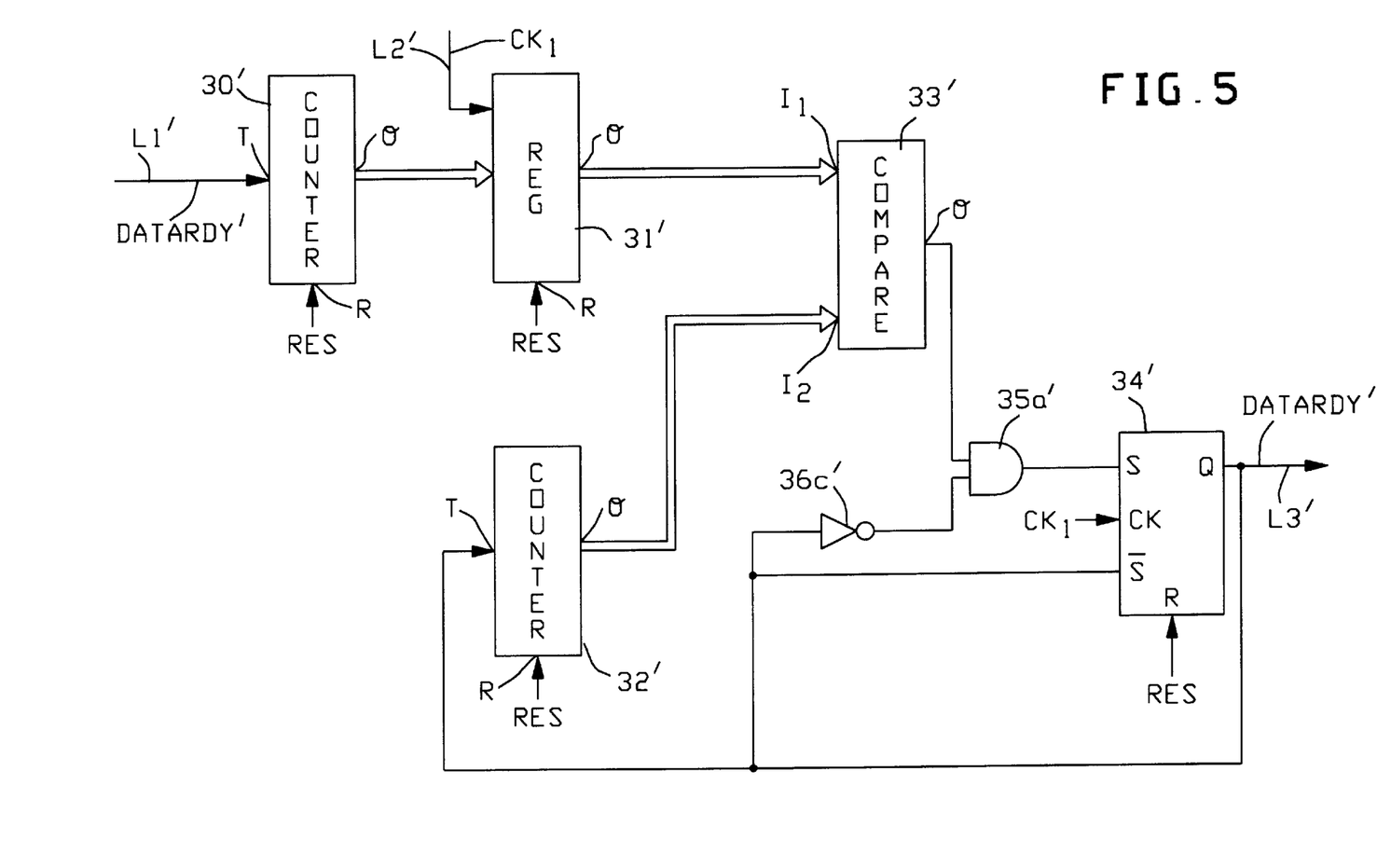
FIG. 5 is a logic diagram of a pulse synchronizing module which constitutes a second embodiment of the present invention; and, FIG. 6 is a timing diagram which illustrates a signal sequence that occurs in the FIG. 5 module.

For example, one modification of the FIG. 2 circuit is shown in FIG. 5. With this modification, each of the FIG. 2 components 30, 31, 32, 33, 34, 35a and 36c are retained; while all of the remaining FIG. 2 components are deleted. In FIG. 5, the components which are retained from FIG. 2 have the same reference numeral and an appended prime. For example, component 30' in FIG. 5 corresponds to component 30 in FIG. 2. Similarly, the input and output leads in FIG. 5 are appended with a prime. Also, with the FIG. 5 modification, a direct connection occurs from the Q output of flip-flop 34 to the $\overline{S}$ input of that flip-flop.

Further in the FIG. 5 embodiment, input lead L1' is shown as receiving the DATARDY' signal; input lead L2' is shown as receiving clock CK1; and output lead L3' is shown as receiving the DATARDY signal. Alternatively, the FIG. 5 circuit can receive the read commands RDCMD on lead L1' in synchronization with clock CK1, and generate a corresponding number of the commands RDCMD' on lead L3' in synchronization with clock CK2. This alternative embodiment is achieved simply by applying clock CK2 to lead L2' in FIG. 5.

All of the DATARDY' signals which are received on lead L1' in the FIG. 5 circuit occur in the form of a pulse; and counter 30' counts the rising edges of those pulses. Register 31' then operates in synchronization with clock CK1 to sample the count that is in register 30'. If the count sample in register 31' does not equal the number of rising edges previously generated (as determined by counter 32'), then the rising edge for a DATARDY output pulse is generated by flip-flop 34' on lead L3'.

That rising edge on lead L3' is fed back to the $\overline{S}$ input of flip-flop 34'. Consequently, a falling edge of the output pulse is generated by flip-flop 34' on lead L3' after one cycle of clock CK1 occurs. Also, the rising edge on lead L3' is fed back to the trigger input of counter 32'; and consequently, the count in counter 32' is incremented by one. Then, if the count in counter 32' equals the count sample in register 31', the output from comparator 33' will be "0". In that case, no further rising edges on the output lead L3' will be generated.

In the FIG. 5 circuit, the count in counter 30' can change at the instant that the count is being sampled by register 31'. This is because the DATARDY' signal and the clock CK1 are asynchronous to each other; and this race scenario is shown as occurring in FIG. 6 at time t45.

Figure 6:
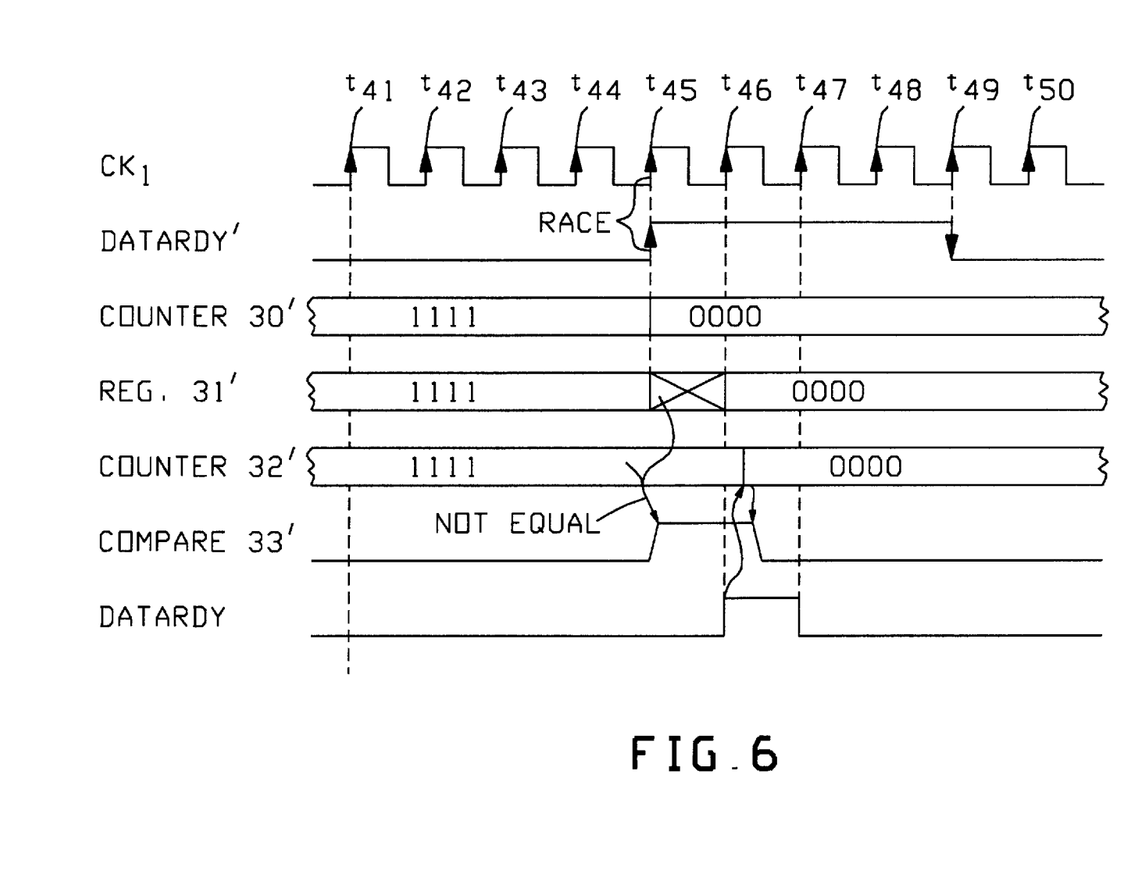

Prior to time t45 in FIG. 6, the counters 30' and 32' as well as register 31', are each illustrated as storing a count of 1111. Then at time t45, the count in counter 30' changes from 1111 to 0000; and that changing count is sampled by register 31'. Thus, the resulting sample in register 31' is indeterminate; and this is indicated in FIG. 6 by an X in register 31' from time t45 to time t46.

If register 31' contains at least one "0" bit from time t45 to t46, then a miscompare will occur between register 31' and the count and counter 32'. Such a miscompare is illustrated in FIG. 6 as a "1" from the comparator 33'.

In response to the "1" from the comparator 33', the Q output of flip-flop 34 switches from a "0" to a "1" in synchronization with the clock CK1 at time t46. This produces the rising edge of the DATARDY signal on lead L3'. Then, one cycle later at time t47, the Q output of flip-flop 34 switches in synchronization with the clock CK1 from a "1", to a "0".

When the Q output of flip-flop 34' is a "0", the output of the comparator 33' is passed through the AND gate 35a' to the S input of flip-flop 34. This occurs after time t47. But by that time, the output of the comparator 33' will be a "0" because register 31' resamples the count in counter 30' at time instants t46 and t47 to thereby replace its indeterminate sample with a correct sample of 0000.

Also, as still another modification, both the FIG. 2 circuit and the FIG. 5 circuit can be changed such that each of the counters 30, 32, 40, 42, 30' and 32' is a down counter, rather than an up counter. With this modification, each counter counts down by one when the trigger input "T" receives a "0" to "1" transition. Each time a count of 0000 is reached, the next "0" to "1" transition on the trigger causes the count to wrap to 1111.

Further, as yet another modification, the number of bits in the count of each of the counters can be any predetermined number, rather than just four bits which are in the illustrated embodiments. When each of the counters is a "K" bit counter, the number of input pulses that have been received on the input lead L1 can at any time instant exceed the number of output pulses that have been generated on the output lead L3 by $2^K - 1$. Thus, as K increases, the number of input pulses which can be received in a burst increases. Conversely, if the input pulses occur infrequently on input lead L1, then each of the counters in the FIG. 2 and FIG. 5 circuits can be reduced to just a single bit counter.

Also, as another modification, the FIG. 5 circuit can be changed such that each output pulse is generated on lead L3' in response to a "1" to "0" transition of the input pulse, rather than in response to the "0" to "1" transition of the input pulse. This modification is achieved simply by inserting an inverter between the lead L1' and the trigger input of counter 30'.

As still another modification, the circuits of FIG. 2 and FIG. 5 can be changed by replacing each of the registers 31, 41, and 31' with a pair of registers which are connected to each other in a pipelined fashion. For example, when this modification is made to the FIG. 5 circuit, the net effect is to insert a second register into the coupling from register 31' to comparator 33'. This second register has a data input connected to the output of register 31', a clock input which receives the clock signal CK1, and an output connected to input I1 of comparator 33'. This modification should be employed if the registers 31, 41 and 31' are permitted to generate output signals in a metastable state when their data input changes while their clock input receives a "0" to "1" transition. By a metastable state is herein meant a state which can change at any time in the clock cycle which follows a "0" to "1" transition on the clock input of the register, rather than a state which can only change immediately after that clock transition occurs.

Further, as still another modification, the circuits of FIG. 2 and FIG. 5 can be used in conjunction with any other circuitry, and not just within the cache memory 10 of FIG.

1. In general, the circuits of FIGS. 2 and 5 can be used wherever digital input pulses need to be received asynchronous to a clock signal, and a corresponding number of digital output pulses need to be generated in synchronization with the clock signal.

Accordingly, it is to be understood that the invention is not limited to just the illustrated preferred embodiments, but is defined by the appended claims.

What is claimed is:

1. A pulse synchronizing module, which is comprised of:
   a pair of input leads which respectively receive a clock signal and digital input pulses that are asynchronous to said clock signal;
   a first counter circuit which is triggered by rising edge transitions in said input pulses, and a second counter circuit which is triggered by falling edge transitions in said input pulses;
   first and second registers which, in synchronization with said clock signal, respectively sample the count that is in said first and second counter circuits; and,
   an output circuit, coupled to said first and second registers, which generates -a) the rising edge of an output pulse, in synchronization with said clock signal, only if the count sample in said first register does not equal the number of rising edges previously generated; and b) the falling edge of said output pulse, in synchronization with said clock signal, only if the count sample in said second register does not equal the number of falling edges previously generated.

2. A pulse synchronizing module according to claim 1 wherein said first and second registers respectively sample the count in said first and second counters such that the samples are indeterminate and contain errors when taken while said counters are triggered.

3. A pulse synchronizing module according to claim 1 wherein said output circuit includes a first feedback counter which counts said number of rising edges previously generated, and a second feedback counter which counts said number of falling edges previously generated.

4. A pulse synchronizing module according to claim 1 wherein each of said counters count up and wrap their count from a maximum count to zero.

5. A pulse synchronizing module according to claim 1 wherein each of said counters count down and wrap their count from zero to a maximum count.

6. A pulse synchronizing module according to claim 1 wherein each of said counters is a single bit counter.

7. A pulse synchronizing module according to claim 1 wherein said module is combined with a two port cache memory in which the two ports operate asynchronous to each other, and wherein said digital input pulses represent respective commands that are passed by said module from one port to the other port.

8. A pulse synchronizing module, which is comprised of:
   a pair of input leads which respectively receive a clock signal and digital input pulses that are asynchronous to said clock signal;
   a counter circuit which is triggered by particular edge transitions in said input pulses;
   a register which, in synchronization with said clock signal, samples the count that is in said counter circuit; and,
   an output circuit, coupled to said register, which generates an output pulse, with rising and falling edges in synchronization with said clock signal, only if the count sample in said register does not equal the number of output pulses previously generated.

9. A pulse synchronizing module according to claim 8 wherein said register samples the count in said counter such that the samples contain errors when taken while said counter is triggered.

10. A pulse synchronizing module according to claim 8 wherein said output circuit includes a feedback counter which counts said number of output pulses previously generated.

11. A pulse synchronizing module according to claim 8 wherein said counter counts up and wraps from a maximum count to zero.

12. A pulse synchronizing module according to claim 8 wherein said counter counts down and wraps from zero to a maximum count.

13. A pulse synchronizing module according to claim 8 wherein said counter is a single bit counter.

14. A pulse synchronizing module according to claim 8 wherein said module is combined with a two port cache memory in which the two ports operate asynchronous to each other, and wherein said digital input pulses represent respective commands that are passed by said module from one port to the other port.

15. A pulse synchronizing module according to claim 8 wherein said particular edge transitions are rising edge transitions.

16. A pulse synchronizing module according to claim 8 wherein said particular edge transitions are falling edge transitions.

* * * * *